United States Patent [19]

Mawhinney

[11] Patent Number: 4,583,060
[45] Date of Patent: Apr. 15, 1986

[54] HIGH SPEED VOLTAGE TUNABLE FREQUENCY FILTER OR FREQUENCY GENERATOR

[75] Inventor: Daniel D. Mawhinney, Livingston, N.J.

[73] Assignee: RCA Corporation, Princeton, N.J.

[21] Appl. No.: 525,478

[22] Filed: Aug. 22, 1983

[51] Int. Cl.$^4$ .............................................. H03B 21/02
[52] U.S. Cl. .................................. 331/172; 331/177 R
[58] Field of Search .................. 331/19, 172, 173, 177

[56] References Cited

U.S. PATENT DOCUMENTS

| | | | |
|---|---|---|---|
| 3,626,315 | 12/1971 | Stirling | 331/172 |
| 4,063,188 | 12/1977 | Mawhinney | 331/11 |
| 4,357,580 | 11/1982 | Mawhinney | 331/1 R |
| 4,365,211 | 12/1982 | Lee | 331/11 |

Primary Examiner—Eugene LaRoche
Assistant Examiner—G. Wan
Attorney, Agent, or Firm—Joseph S. Tripoli; Robert L. Troike; Raymond E. Smiley

[57] ABSTRACT

A frequency generator or filter which includes a signal source of simultaneous multiple frequencies, a voltage controlled oscillator (VCO), a circulator coupled between the signal source and frequency terminal of the VCO and a source of control voltage signals coupled to the control voltage terminal of the VCO. A control voltage corresponding to a desired one of the frequencies produced by the signal source is applied to the VCO causing it to produce a frequency approximating the desired frequency. Then the signal from the frequency source injection locks the VCO to exactly the desired frequency.

5 Claims, 1 Drawing Figure

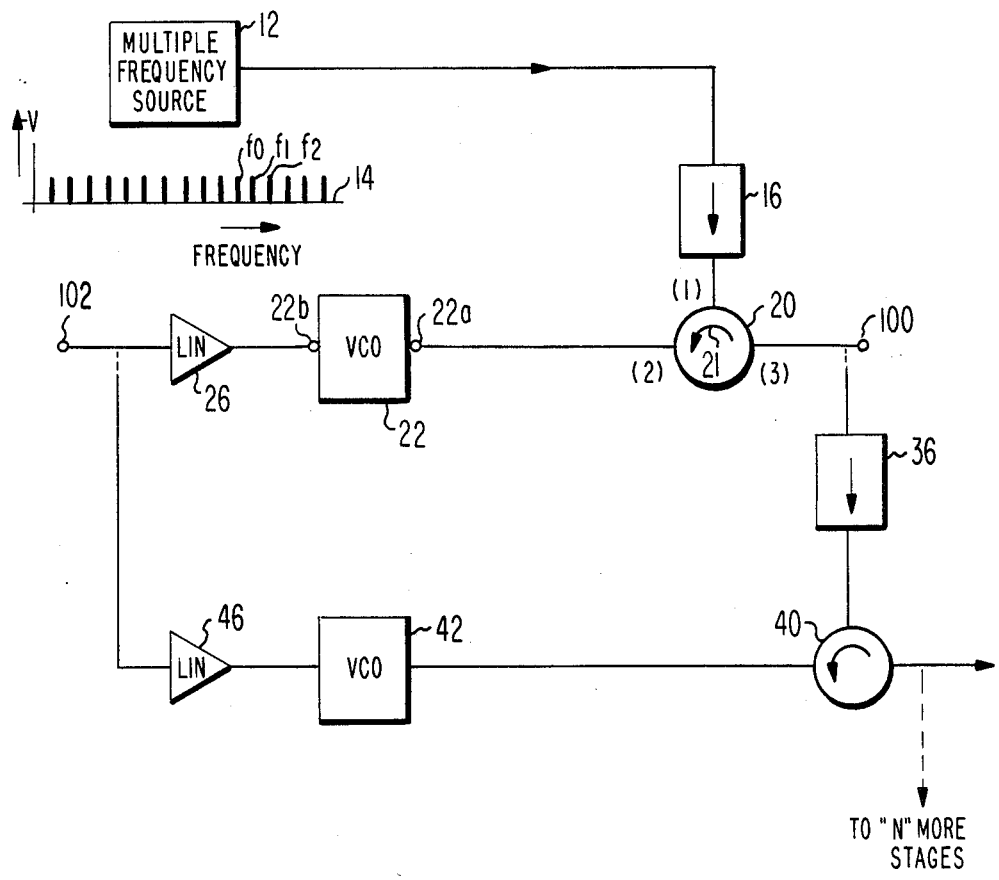

HIGH SPEED VOLTAGE TUNABLE FREQUENCY FILTER OR FREQUENCY GENERATOR

This invention relates to a circuit for producing a signal at any one of a preselectable plurality of frequencies and, more particularly to such a circuit operating in open loop configuration.

BACKGROUND OF THE INVENTON

There are numerous systems where it is required to generate a specific frequency or to select a specific narrow frequency band rapidly by electrical tuning. A selectable narrow band generator finds use in transmitters for electronic countermeasures and secure communications systems. Other systems may require a tunable filter to select a narrow frequency band as in a receiver to eliminate signals at all frequencies other than the band of interest. In both instances, the frequency of interest must be rapidly changeable for such applications as sampling, frequency hopping, encription and other similar uses.

Some circuits for generators or electronically tunable filters for selecting one of a plurality of frequencies involve closed loop feedback systems which provide very accurate frequency selection but are slow to lock on to frequency. Other circuits involve open loop systems which shift frequency rapidly but do not provide for accurate frequency selection.

SUMMARY OF THE INVENTION

In accordance with a preferred embodiment of the present invention a circuit for producing a signal at a selected one of a plurality of discrete frequencies comprises in combination means for producing a signal at a simultaneous plurality of different discrete frequencies, a voltage controlled oscillator (VCO) having a control voltage input terminal and a frequency signal output terminal, means producing a signal coupled to the input terminal for causing the VCO to produce at its output terminal a frequency which approximates a desired one of the different discrete frequencies and means coupling the means producing the signal at the plurality of different discrete frequencies to the output terminal for injection locking the VCO exactly to the desired one of the frequencies.

BRIEF DESCRIPTION OF THE DRAWING

The sole FIGURE is a frequency generator or frequency filter circuit in accordance with a preferred embodiment of the present invention.

DETAILED DESCRIPTION

Referring to the sole FIGURE a source 12 of simultaneously produced multiple frequencies may produce the signal illustrated at callout 14 which is plotted as frequency on the horizontal axis versus amplitude on the vertical axis. The nature of source 12 depends on the operation of the circuit as a whole. If the circuit is to be operated as a selectable frequency generator, then source 12 produces all the frequencies that the generator is designed to generate. An example of such as source is the Model 8406A comb generator manufactured by Hewlett-Packard which produces a series of regularly spaced discrete frequencies at increments of 1, 10 or 100 MHz to beyond 5 GHz.

If the circuit is being used as a filter, source 12, which may be a comb generator of the above type connected externally to the circuit or a series of signals at known frequencies or channels, produces a plurality of discrete frequencies all but a selected one of which are to be filtered out. In either case source 12 is connected to an isolator 16 such as an Aercom IBS 7012 which operates over the 7 to 12 GHz frequency band. Isolator 16 is connected to one port—arbitrarily labeled with the legend (1)—of a three-port circulator 20 of conventional design such as UTE Microwave Model C7-5158-0 covering 8 to 12 GHz. The second port (2) in the direction of signal transmission (signal transmission is indicated by arrow 21) is connected to the frequency output terminal 22a of a voltage controlled oscillator (VCO) 22. The third port (3) of circulator 20 is connected either to circuit output terminal 100 or to a second isolator 36 which may be identical to isolator 16. The purpose of the second isolator will be described hereinafter. VCO 22 which includes a voltage control input terminal 22b is typically a microwave oscillator which generates a frequency which can be electrically tuned by varying the voltage on a varactor diode coupled to terminal 22b which is part of the resonant circuit. The Model FS-9220-5 VCO manufactured by Frequency Sources, Inc. is an example of a VCO which operates from 8 to 23 GHz.

Circuit input terminal 102 is serially receptive of voltages corresponding to specific frequencies to be produced at output terminal 100. Terminal 102 is connected to at least one linearizing circuit 26 and possibly to other linearizing circuits such as 46. A linearizing circuit often consists of a series of voltage reference diodes and resistors arranged to produce a line segment approximation of a desired curve. The purpose of linearizing circuit 26 and of other linearizing circuits, if used, is to tailor voltage levels produced at terminal 102 to the specific nominal voltage levels required by VCO 22 to produce desired frequency values therefrom. Some typical linearizing or curve shaping circuits are shown in "Electronic Design", Aug. 19, 1982, pp. 176–178 by I. Yuval.

By way of example (and it will be understood that these figures are not intended to be realistic) assume that nominally voltage levels of 1.0, 1.1 and 1.2 applied to VCO 22 result in output frequencies of 1.0, 1.1 and 1.2 MHz, respectively, but that in reality a specific VCO requires 1.12 volts to produce 1.1 MHz output. In such a case linearizing circuit 26 would respond to a control voltage of 1.1 volts by generating a signal at 1.12 volts to be applied to control terminal 22b of VCO 22.

It will be realized that even with linearizing circuit 26 the precise voltage required to cause VCO 22 to produce desired frequencies varies as a function of environmental conditions (particularly temperature) and component degradation within VCO 22 and linearizing circuit 26.

In accordance with the invention it is only necessary that VCO 22 be tuned to approximately the desired frequency. Then the precise frequency from those produced by source 12 will via isolator 16 and circulator 20 injection lock the VCO to the precisely desired frequency which is passed to port (2) of circulator 20 and thence from port (3) to the circuit output terminal 100.

Operation of the circuit comprising elements 12, 16, 20, 22 and 26 as a frequency generator is as follows. Source 12 produces all the frequencies desired to be produced at terminal 100. When a particular one of those frequencies f1 is desired to be produced at terminal 100, a voltage nominally corresponding to the desired frequency is applied to terminal 102 from some source of such voltages thereby tuning VCO 22 to approximately f1. Then typically in 25 nanoseconds the frequency f1 bounded by frequencies f0 and f2 from source 12 injection locks VCO 22 to precisely frequency f1. The only requirement for the frequencies produced by source 12 relative to the tuning of VCO 22 is that the frequency being produced by the VCO prior to injection locking must be closer to f1 than to f0 or f2 of source 12. When a new frequency is desired to be produced at terminal 100 a new corresponding voltage is applied to terminal 102 and the operation above described repeats.

A one-stage circuit comprising elements 26, 22 and 20 produces a gain of approximately 10 dB for the selected frequency while the adjacent non-selected frequencies may be from 20 to 30 dB lower in amplitude. If this is not sufficient for a particular application, then additional stages such as those comprising elements 46, 42 and 40 (which are identical to respective elements 26, 22 and 20) can be added for further amplitude separation of the selected frequency line and the unwanted adjacent frequency lines.

Filter operation is identical to generator operation except that the signal input is not contained within the circuit as before. For example, the comb generator, if used, would be completely external or a series of incoming signals—such as might be received from a channelized transmitter with significant separation between channels—would be filtered by tuning the VCO or VCO's to the desired channel and having them lock to the input signal similar to a phaselock receiver but in a much shorter time than with a phaselocked loop. When used in the generator mode, the system could also function indirectly as a filter by selecting one of the pregenerated signals as the local oscillator signal for a conventional super-heterodyne receiver—such as a television system selecting from among many channels.

What is claimed is:

1. A circuit having an output terminal for producing at said output terminal a signal at a given output frequency, comprising in combination:
   means producing a given frequency;
   first and second voltage controlled oscillators (VCO) each having a control voltage input terminal and a frequency signal output terminal;
   means coupled to said input terminals of said VCOs and producing a voltage signal to cause said VCOs to produce at their output terminals a signal of approximately said given frequency; and
   first and second three-port circulators, a first port of said first circulator being coupled to said means producing said given frequency, a second port of said first and second circulators being coupled to said first and second VCO output terminals, respectively, a third port of said first circulator being coupled to a first port of said second circulator and a third port of said second circulator being coupled to said output terminal of said circuit, said first and second VCOs being injection locked to the given frequency by the signals at said second ports of said first and second circulators.

2. The combination as set forth in claim 1 further including a linearizer circuit coupled between said input terminal of each said VCO and means producing a voltage signal.

3. A circuit having an output terminal for producing a signal at a selectable one of a plurality of discrete frequencies, comprising in combination:
   means producing a plurality of simultaneously present discrete frequencies;
   first and second voltage controlled oscillators (VCO) each having a control voltage input terminal and a frequency signal output terminal;
   means coupled to said input terminals of said VCOs and producing a voltage signal to cause said VCOs to produce at their output terminals a signal of approximately a desired one of said discrete frequencies; and
   first and second three-port circulators, a first port of said first circulator being coupled to said means producing a plurality of simultaneously present discrete frequencies, a second port of said first and second circulators being coupled to said first and second VCO output terminals, respectively, a third port of said first circulator being coupled to a first port of said second circulator and a third port of said second circulator being coupled to said output terminal of said circuit, said first and second VCOs being injection locked to the desired frequency by the signals at said second ports of said first and second circulators.

4. The combination as set forth in claim 3 wherein said means producing a plurality of simultaneously present discrete frequencies comprises a comb generator.

5. The combination as set forth in claim 3 further including a linearizer circuit coupled between said input terminal of said VCO and means producing a voltage signal.

* * * * *